(12) United States Patent
Schell

(10) Patent No.: US 9,753,354 B2
(45) Date of Patent: Sep. 5, 2017

(54) ANALOGUE-DIGITAL CONVERTER AND METHOD FOR GENERATING A DIGITAL DATA STREAM

(71) Applicant: Fraunhofer Gesellschaft Zur Förderung Der Angew. Forschung E.V., München (DE)

(72) Inventor: Martin Schell, Berlin (DE)

(73) Assignee: Fraunhofer Gesellschaft Zur Forderung Der Angew. Forschung E.V., Munich (DE)

( * ) Notice: Subject to any disclaimer, the term of this patent is extended or adjusted under 35 U.S.C. 154(b) by 0 days.

(21) Appl. No.: 14/778,252

(22) PCT Filed: Mar. 18, 2014

(86) PCT No.: PCT/EP2014/055387
§ 371 (c)(1),
(2) Date: Sep. 18, 2015

(87) PCT Pub. No.: WO2014/147058
PCT Pub. Date: Sep. 25, 2014

(65) Prior Publication Data
US 2016/0282703 A1  Sep. 29, 2016

(30) Foreign Application Priority Data
Mar. 18, 2013 (DE) .................. 10 2013 204 731

(51) Int. Cl.
*H03M 1/12* (2006.01)
*G02F 7/00* (2006.01)
*H03M 1/20* (2006.01)

(52) U.S. Cl.
CPC .............. *G02F 7/00* (2013.01); *H03M 1/121* (2013.01); *H03M 1/124* (2013.01); *H03M 1/20* (2013.01); *H03M 1/1245* (2013.01)

(58) Field of Classification Search
CPC ................................ H03M 1/124; H03M 1/20
(Continued)

(56) References Cited

U.S. PATENT DOCUMENTS

| 5,010,346 A * | 4/1991 | Hamilton ............ G02F 7/00 250/227.12 |
| 6,265,999 B1 * | 7/2001 | Prucnal ............ H04L 7/0075 341/137 |

(Continued)

FOREIGN PATENT DOCUMENTS

WO    2012073243 A1    6/2012

OTHER PUBLICATIONS

Murmann, Boris, "ADC Performance Survey 1997-2012," Stanford University, available at www.stanford.edu/~murmann/adcsurvey.html.
(Continued)

*Primary Examiner* — Peguy Jean Pierre
(74) *Attorney, Agent, or Firm* — Alix, Yale & Ristas, LLP

(57) ABSTRACT

An analog-digital converter has an optical input stage configured to convert an analog input signal (S(t)) into a phase-modulated optical signal and to supply it to a hybrid coupler having a plurality of output waveguides, each being connected to at least one photodiode. The photodiodes are each connected to the input of an associated analog-digital converter via which an analog electrical input signal is convertible into a digital output signal. An output stage is configured to form the digital data stream at the output from the digital output signals of the analog-digital converter, and the output stage may be configured to select the output signal of the analog-digital converter which lies within a predefinable range of the amplitude and has a predefinable slope and/or is larger than a predefinable adjacent output signal.

12 Claims, 5 Drawing Sheets

(58) Field of Classification Search
USPC ......... 341/137, 155; 359/237, 245, 340, 341
See application file for complete search history.

(56) References Cited

U.S. PATENT DOCUMENTS

| | | | | |
|---|---|---|---|---|
| 9,287,993 | B1* | 3/2016 | Adleman | .................. H03D 7/00 |
| 2004/0096143 | A1* | 5/2004 | Shpantzer | .......... G02B 6/12004 |
| | | | | 385/16 |
| 2007/0025737 | A1* | 2/2007 | Kamio | .................. H04B 10/677 |
| | | | | 398/150 |
| 2011/0122477 | A1* | 5/2011 | Ridgway | .......... H04B 10/25753 |
| | | | | 359/279 |
| 2012/0106984 | A1* | 5/2012 | Jones | .................... H04L 27/223 |
| | | | | 398/214 |
| 2012/0170926 | A1* | 7/2012 | Van Leeuwen | .... H04B 10/0795 |
| | | | | 398/9 |
| 2012/0212360 | A1 | 8/2012 | Kanter et al. | |
| 2013/0113641 | A1* | 5/2013 | Sudo | ..................... G02F 1/3517 |
| | | | | 341/137 |

OTHER PUBLICATIONS

International Search Report dated Sep. 30, 2014 (PCT/EP2014/055387).
United States Statutory Invention Registration No. H353 to Taylor, published on Oct. 6, 1987.
Ali, Ahmed M. A. et al., "A 16-bit 250-MS/s if Sampling Pipelined ADC With Background Calibration," IEEE Journal of Solid-State Circuits, vol. 45(12), 2602-2612, Dec. 2010.
Callahan, Patrick T. et al., "Photonic Analog-to-Digital Conversion," Johns Hopkins APL Technical Digest, vol. 30 (4), 280-286 (2012).
Lagali, N.S. et al., "Theory of Variable-Ratio Power Splitters Using Multimode Interference Couplers," IEEE Photonics Technology Letters, vol. 11(6), 665-667, Jun. 1999.
Murmann, Boris, "A/D Converter Trends: Power Dissipation, Scaling and Digitally Assisted Architectures," IEEE 2008 Custom Integrated Circuits Conference, 105-112, 2008.
Murmann, Boris, "Limits on ADC Power Dissipation," Analog Circuit Design, 351-367, 2006.
Murmann, Boris, ADC Performance Survey 1997-2012, Stanford University.
Sarantos, Chris et al., "An Unbalanced MZM based Photonic Analog-to-Digital Converter," Electrical and Computer Engineering Department, University of California, Santa Barbara, IEEE 2007, 110-111.
Schreier, Richard et al., "Understanding Delta-Sigma Data Converters," A John Wiley & Sons, Inc. Publication, IEEE Press (submitted in two files—Part 1 and Part 2).
Valley, George C., "Photonic analog-to-digital converters," Optics Express, vol. 15(5), 1955-1982, Mar. 5, 2007.
Walden, Robert H., "Analog-to-Digital Converter Survey and Analysis," IEEE Journal on Selected Areas in Communications, vol. 17(4), 539-550, Apr. 1999.

* cited by examiner

ANALOGUE-DIGITAL CONVERTER AND METHOD FOR GENERATING A DIGITAL DATA STREAM

FIELD OF THE DISCLOSURE

The present invention relates to an analog-digital converter having at least one input being adapted to receive at least one analog input signal, and having at least one output which is configured to output a digital data stream which represents the analog input signal. Furthermore, the present invention relates to a method for generating a digital data stream which represents an analog input signal. Devices and methods of the kind specified are, for example, used to digitize the output signals of sensors, audio data, or video data, in order to be able to further process the signals digitally.

BACKGROUND

An analog-digital converter of the kind specified is known from P. T. Callahan, M. L. Dennis, T. R. Clark: Photonic analogue to digital conversion, John Hopkins APL Technical Digest, vol. 30, no. 4 (2012) 280. This analog-digital converter essentially carries out two functions. On the one hand, the amplitude of the analog input signal is sampled in discrete steps. On the other hand, the time profile is quantized at a predefinable sampling rate. According to the Nyquist Theorem, the sampling rate of the analog signal must be at least twice the maximum frequency of the analog input signal in order to allow for an unambiguous reconstruction of the analog input signal from the digital data. The amplitude is quantized in a predefinable number of steps at the times defined by the sampling rate. For example, an analog-digital converter having a resolution of eight bits is able to distinguish 256 steps of the amplitude. Errors during the analog/digital conversion occur in particular due to a resolution of the amplitude which is too low or due to errors in the quantization of the time axis. The higher the bandwidth of the input signal is, the greater the accuracy with which the quantization of the time axis must be carried out. Thus, conventional analog-digital converters operating purely electronically reach their limits, in particular in the case of high frequencies of the analog signal and/or high accuracy requirements.

The aforementioned related art therefore provides for modulating the electrical analog input signal onto an optical carrier, converting this modulated signal once again into an electrical signal by means of a photodiode, and supplying it to a known electronic analog-digital converter. A short-pulse laser is used as an optical carrier signal, which generates pulsewidths of less than one picosecond. These laser pulses having a constant amplitude are supplied to an electro-optical modulator which is controlled by the analog input signal. A pulse train is available at the output of the electro-optical modulator, in which the time interval of the individual pulses represents the quantization of the time axis, and the amplitude of the input signal is encoded onto the optical carrier signal as an amplitude variation of the individual pulses. Due to the high time constancy of the laser, the quantization of the time axis is able to be carried out at a high frequency. The optical signal is distributed to multiple parallel analog-digital converters using an optical switch having a high switching frequency, so that a multiple of the bandwidth is achieved with respect to a purely electrical analog/digital conversion.

However, this known analog-digital converter has the disadvantage that the resolution of the downstream electronic analog-digital converter limits the available resolution.

SUMMARY

Based on the related art, the object of the present invention is thus to provide an analog-digital converter which makes possible a higher resolution and/or a higher sampling frequency; thus, analog input signals having a high frequency may be reliably digitized having high resolution.

This object is achieved according to the present invention by an analog-digital converter as claimed in claim 1 and a method as claimed in claim 10.

According to the present invention, an analog-digital converter is provided which has at least one input, to which at least one analog input signal may be supplied. The analog input signal may, for example, be an audio or video signal which is to be digitally transmitted, processed, and/or stored. In other specific embodiments of the present invention, the at least one analog input signal may be the output signal of a sensor or a transducer which determines a physical value, for example, in a vehicle or airplane, a radar installation, or in an industrial production facility. Of course, the present invention is not limited to the aforementioned examples. In other specific embodiments of the present invention, the at least one analog input signal may also originate from another source.

The analog-digital converter is configured to generate a digital data stream which represents the analog input signal. The digital data stream may be provided as a serial or parallel data stream at the output of the analog-digital converter. The signal may be digitized at a predefinable sampling rate and a predefinable resolution within the analog-digital converter. It is intended that the sampling frequency is at least twice the maximum frequency of the analog input signal, and the following relationship applies to the accuracy of the sampling frequency or the jitter $\delta t$: $\delta t < 1/(2^q \pi f_0)$, where q describes the resolution of the analog-digital converter in bits, and $f_0$ denotes the maximum frequency of the input signal.

In order to reliably digitize analog input signals having a high frequency, for example, greater than 10 GHz, greater than 20 GHz, or greater than 40 GHz, it is provided according to the present invention that the analog-digital converter has an optical input stage which is configured to convert the analog input signal into a phase-modulated optical signal. For this purpose, the optical input stage may contain at least one local oscillator which emits laser radiation of a predefinable wavelength or frequency. The light generated by the local oscillator may be divided into a signal path and a reference path. By changing the propagation time of the light in the signal path as a function of the analog input value, a phase shift may occur between the optical signal in the signal path and the reference path which is a function of the amplitude of the analog input signal.

The phase-modulated optical signal is supplied to at least one hybrid coupler including a plurality of input waveguides and a plurality of output waveguides. The optical power coupled into the hybrid coupler is distributed to the output waveguides as a function of the phase difference of the input signals. Thus, an amplitude-modulated analog optical signal is available at each output of the hybrid coupler which carries the information of the analog electrical input signal.

Furthermore, the optical signal of at least two output waveguides, each including at least one photodiode, is now converted into an electrical signal. In some specific embodiments of the present invention, all output waveguides may be connected to associated photodiodes, so that all output signals of the hybrid coupler are further processed. The resolution and/or the cutoff frequency of the analog-digital converter according to the present invention may thereby be increased.

The electrical connecting contacts of each of the photodiodes are connected to the input of an electronic analog-digital converter which is known per se. In some specific embodiments of the present invention, a sample-and-hold element may be situated between the output of the photodiode and the input of the analog-digital converter, which allows holding the analog output signal of the photodiode briefly at a defined value which was provided at a predefinable point in time at the output of the photodiode. As a result, the quantization of the amplitude in the downstream analog-digital converter may be carried out with high accuracy even in the case of rapid changes in the optical input signal. In some specific embodiments of the present invention, the analog-digital converter and the sample-and-hold element may be integrated into a component, thereby ensuring a low price, a low space requirement, and a common specification of both components. If the analog input signal changes slowly compared to the conversion time of the analog-digital converters, the sample-and-hold element may be omitted in some specific embodiments of the present invention.

A digital electrical output signal is available at the output of the analog-digital converter which represents the analog input signal of the analog-digital converter. Since at least two analog-digital converters are used, preferably, however, a number of analog-digital converters corresponding to the number of output waveguides of the hybrid coupler, the digital output signal is available multiple times.

The digital output signals, which constitute the digital output signal of the analog-digital converter from the signals of the analog-digital converters, are supplied to an output stage. For this purpose, the output stage selects the output signal of an analog-digital converter for each value range of the analog input signal. Since each analog-digital converter must therefore quantize only a subrange of the input amplitude, the resolution of the overall system increases using a plurality of digital-analog converters connected in parallel.

In some specific embodiments of the present invention, the optical input stage may include at least one Mach-Zehnder modulator. In some specific embodiments, the Mach-Zehnder modulator may include a fused coupler in order to divide coupled-in light of a laser into a reference path and a signal path. The light of the reference path is able to leave the Mach-Zehnder modulator essentially unchanged. The voltage of the analog input signal may affect a segment of the signal path in such a way that the index of refraction of the waveguide changes as a function of the applied voltage. As a result, there is a phase shift of the optical signal guided in the signal path. Thus, an analog optical phase-modulated signal may be generated at the output of the Mach-Zehnder modulator which carries the information of the analog input signal.

In some specific embodiments of the present invention, the laser used as a local oscillator may be at least a laser diode. Such a laser diode is simple to operate, mechanically rugged, and due to its small size, is easy to integrate into the analog-digital converter.

In some specific embodiments of the present invention, the laser used may be operable in continuous-wave operation. As a result, the continuously variable electrical input signal may be converted into a continuous optical signal, so that there is no loss of information.

In some specific embodiments of the present invention, the laser used may be operable in pulsed operation. In some specific embodiments of the present invention, the laser may generate pulsewidths of less than one nanosecond or less than one picosecond or less than 100 femtoseconds. These laser pulses may be amplitude-modulated, so that the time interval of the individual pulses represents the quantization of the time axis, and the amplitude of the input signal is encoded as an amplitude variation of the individual pulses on the optical carrier signal. Due to the high time constancy of the laser, the quantization of the time axis in this specific embodiment may occur at a high frequency, so that an increase of the bandwidth may be achieved via multiplexing.

In some specific embodiments of the present invention, the number of output waveguides of the hybrid coupler may be $2^Q$. In some specific embodiments of the present invention, Q may be an integer chosen from the interval from 1 to 4. This ensures that a sufficient number of parallel signal paths are available for operating the parallel analog-digital converters, and that the signals are easily able to be assembled into the output signal of the analog-digital converter.

In some specific embodiments of the present invention, the output stage selects the output signal of an associated digital-analog converter as a function of the phase difference of the input signal of the hybrid coupler, in order to provide it as the output signal of the digital-analog converter. As a result, the selection may occur in a simple manner via a digital signal processor or a conversion table, so that the selection may be carried out reliably even at a high data rate or for input signals having a high cutoff frequency. Since each analog-digital converter must process only a portion of the total signal amplitude or the total range of the phase shift, the resolution of the analog-digital converter is increased.

In some specific embodiments of the present invention, the output stage is configured to select the output signal of the analog-digital converter which lies within a predefinable range of the amplitude and has a positive slope and/or is larger than a predefinable adjacent output signal. As a result of the limitation to a predefinable range of the amplitude, the output signal of the hybrid coupler may be limited to the approximately linear sections of the sine curves. As a result, it is possible to omit a complex equalization of the digital output signal. Since, in the case of a larger number of output signals of the hybrid coupler, a plurality of output signals lies in the desired range of the amplitude under some circumstances, it is possible to select one of the output signals via an additional selection criterion. For example, the curve may always be chosen having a positive slope, or the curve may always be chosen having a negative slope. In addition or alternatively, an additional selection criterion which may be used, in which the output signal is selected which is larger than a predefinable adjacent output signal. For example, the adjacent signal on the right may always be selected. The upper and lower limits of the amplitude and the slope to be selected and/or the output signal to be compared with a preselected output signal may be stored in a table, so that the selection may be carried out rapidly and simply via a digital signal processor or possibly also via a microprocessor. Therefore, it is no longer necessary to perform complex calculations for selecting the correct signals during the operation of the analog-digital converter, thus allowing the maximum operating frequency to be increased.

In some specific embodiments of the present invention, the hybrid coupler may have $2^Q$ output waveguides, and each of the parallel analog-digital converters may have a resolution of P bits. In this case, the analog-digital converter may be operated in such a way that the analog input signal may be provided at its output having a resolution of (P+Q) bits. For example, if each of the analog-digital converters has a resolution of 10 bits, by using two parallel analog-digital converters, a resolution of 11 bits may be obtained. By using eight parallel analog-digital converters, a resolution of 13 bits may be obtained.

BRIEF DESCRIPTION OF THE DRAWINGS

The present invention will be explained below in greater detail based on figures, without limiting the general idea of the present invention.

DETAILED DESCRIPTION

Figure 1:
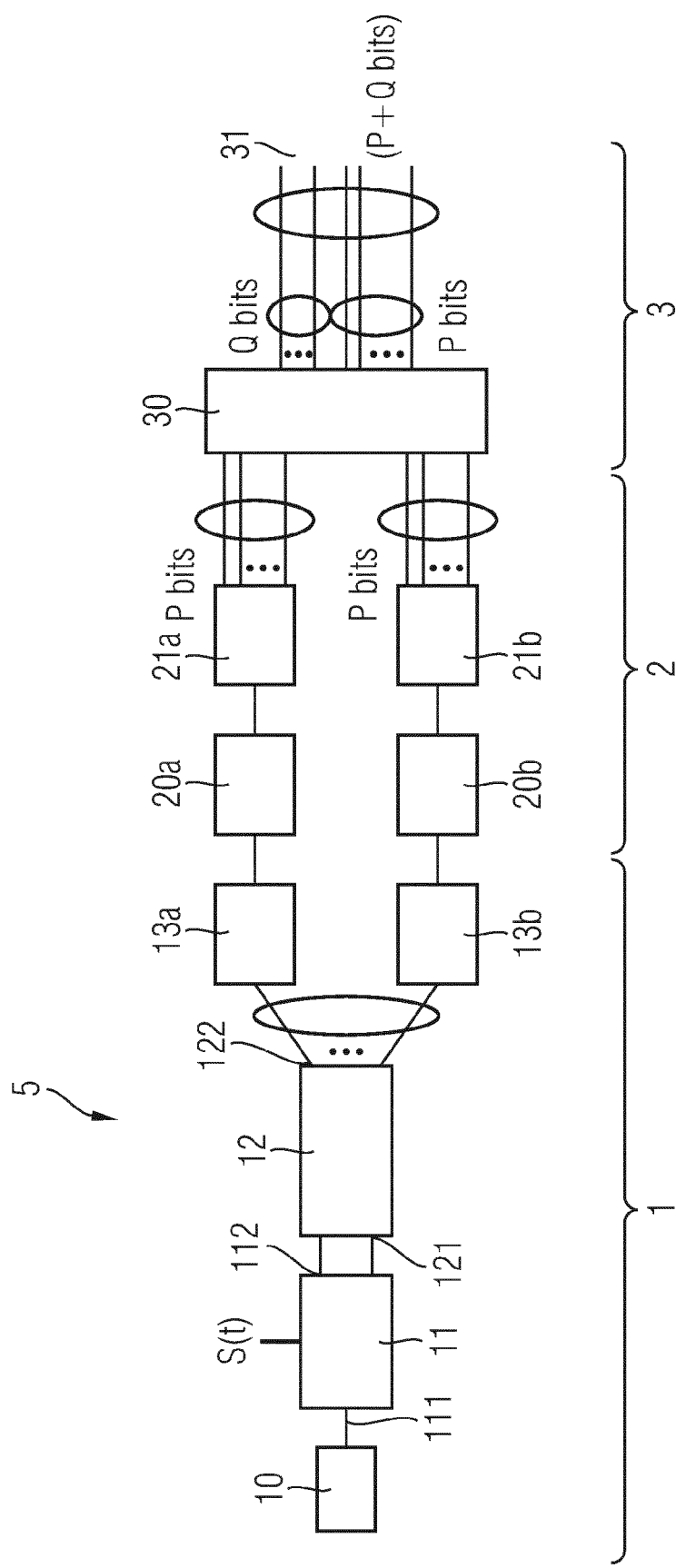
FIG. 1 shows a block diagram of one embodiment of the present invention.

FIG. 1 shows a block diagram of one embodiment of the present invention. The provided analog-digital converter has an optical input stage 1. The outputs of the optical input stage 1 are connected to the corresponding inputs of an analog-digital converter stage 2. Its outputs are supplied to an output stage 3. The output 31 of the output stage 3 forms the output of the provided analog-digital converter.

The optical input stage 1 will be described below based on FIGS. 1 and 2. The input stage 1 includes a laser 10 which provides an optical carrier signal as a local oscillator. In some specific embodiments of the present invention, the laser 10 may be a laser diode or may include one. In some specific embodiments of the present invention, the laser 10 may function in continuous-wave operation and thus provide a time-constant optical signal.

The light of the laser 10 is supplied to a Mach-Zehnder modulator 11 via a waveguide. The Mach-Zehnder modulator 11 has an optical input 111 and two optical outputs 112. Furthermore, the Mach-Zehnder modulator 11 has at least one electrical input to which at least one analog input signal S(t) may be supplied.

Figure 2:
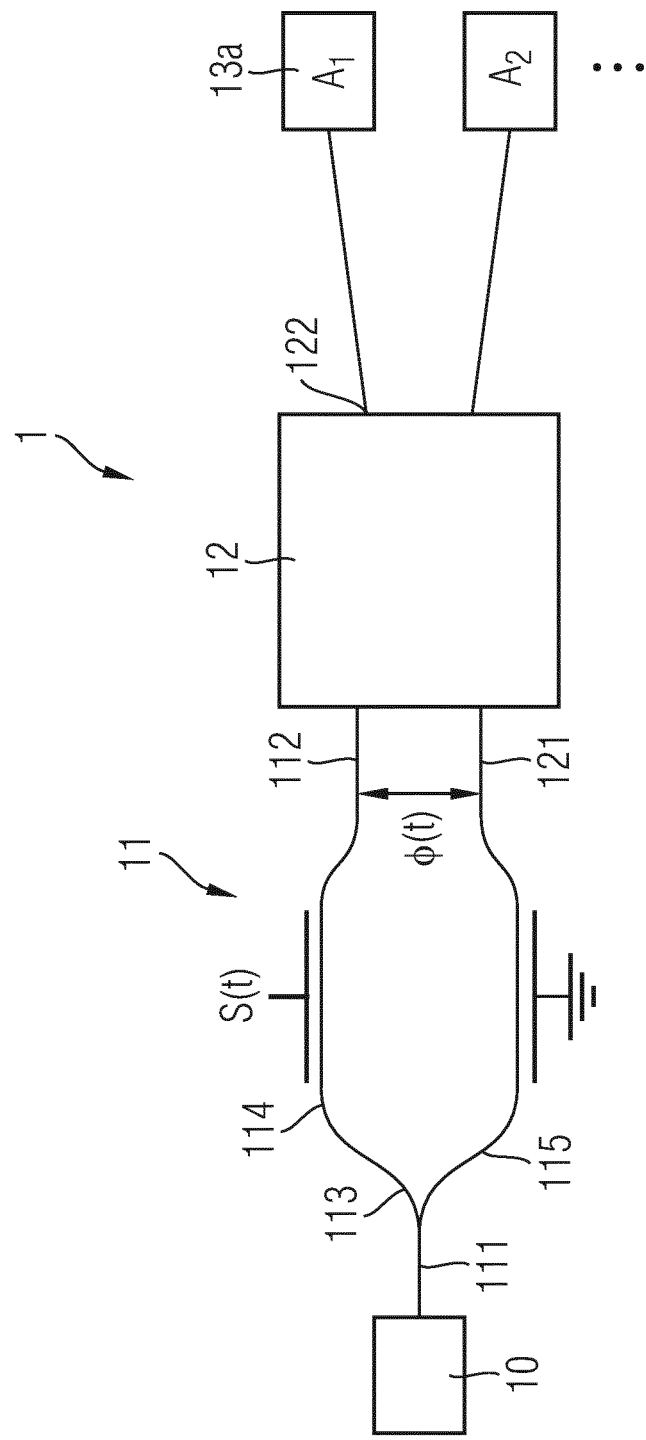
FIG. 2 shows the structure of the optical input stage.

As is apparent from FIG. 2, the optical input 111 is connected to a coupler 113. The coupler 113 may, for example, be a fused coupler between two waveguides, or a 3 dB coupler which is known per se, or a hybrid coupler. It is essential for the function of the modulator that the optical carrier signal of the laser 10 is divided into a signal path 112 and a reference path 115. The portion of the laser light guided in the reference path 115 leaves the modulator 11 essentially unchanged. The index of refraction of a segment of the signal path 114 is changed via the voltage of the analog input signal S(t) as a function of the applied voltage, so that a phase shift of the light occurs between the reference path 115 and signal path 114. Thus, a phase-modulated analog optical signal is available at the outputs 112, which carries the information of the electrical input signal S(t).

The outputs 112 of the modulator 11 are supplied to corresponding inputs of the hybrid coupler 12. The hybrid coupler 12 may have $2^Q$ outputs 122. For example, the number of outputs 122 may be 2, 4, 8, or 16. Accordingly, the number of inputs 121 is also generally 2, 4, 8, or 16. If more than two inputs 121 are available, two of these inputs are selected, in order to accommodate the signals of the outputs 112 of the modulator. In this case, the remaining inputs 122 may remain unconnected.

The hybrid coupler 12 is configured to transfer the signals of the modulator 11 provided at its input into the plurality of output waveguides 122. The intensity at the individual outputs 122 changes as a function of the phase relationship of the input signals at the input 121. Thus, the hybrid coupler transforms the phase-modulated signal at its input into a plurality of amplitude-modulated signals at its output.

Figure 3:
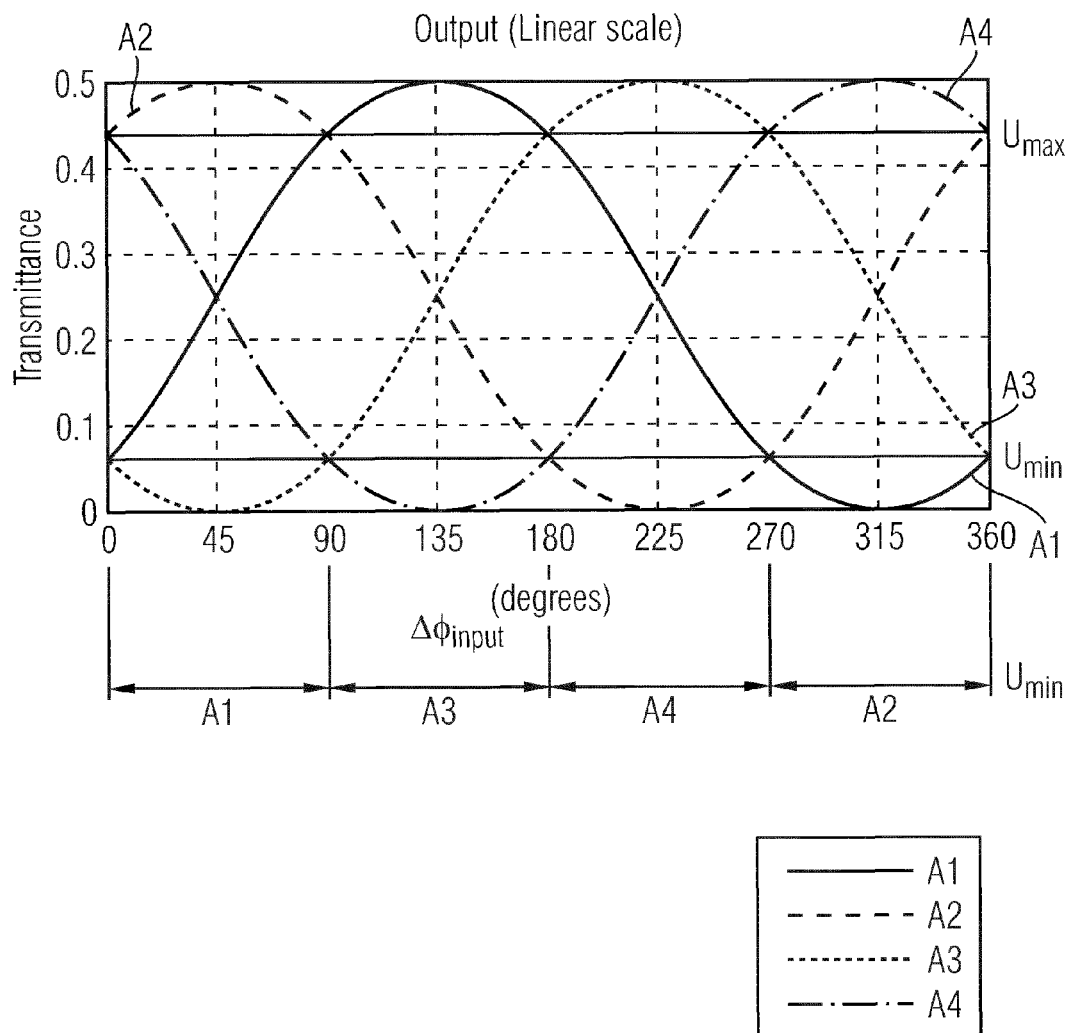
FIG. 3 shows an example of the output signals of the photodiodes of the optical input stage for a hybrid coupler having four outputs.
Figure 4:
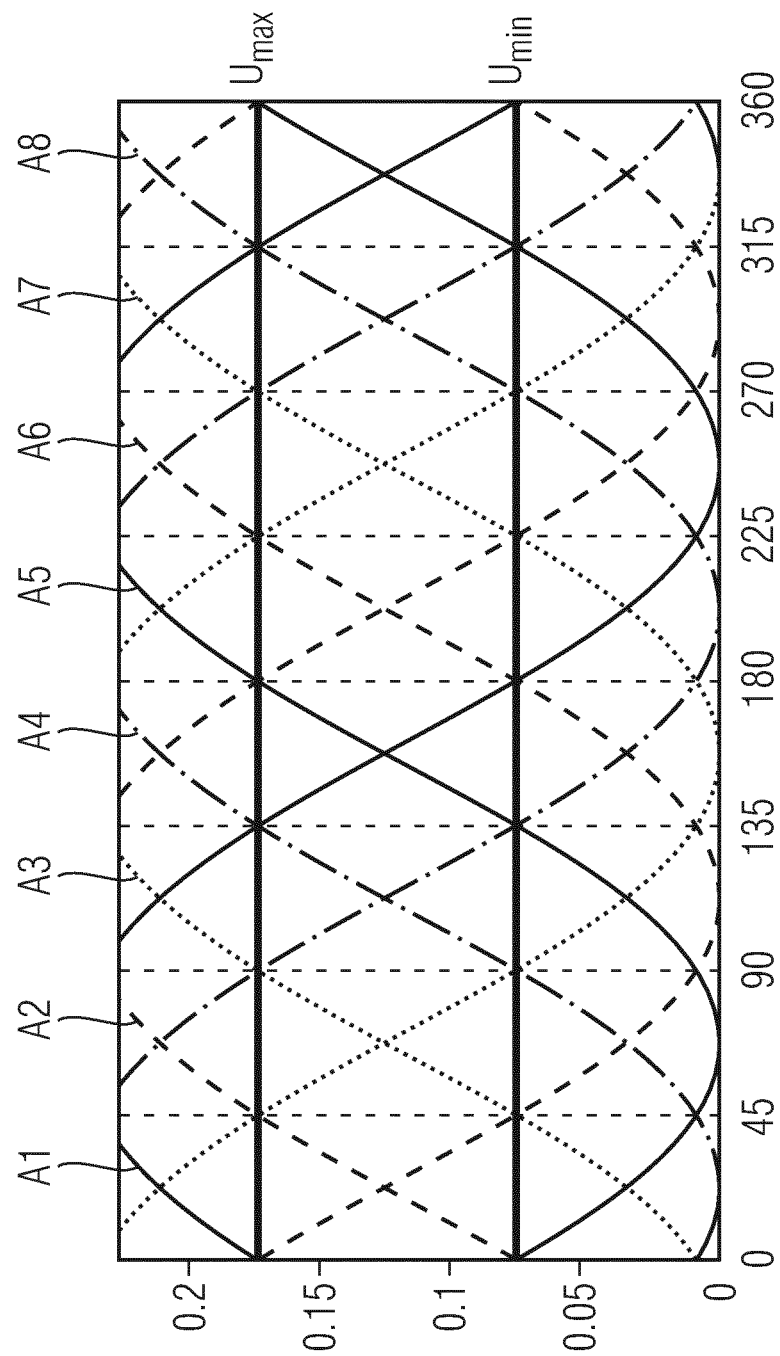
FIG. 4 shows an example of the output of the photodiodes for a hybrid coupler having eight outputs.

An example of four output signals of a hybrid coupler having four output waveguides 122 is shown in FIG. 3. FIG. 4 shows an additional example of eight output signals of a hybrid coupler having eight output waveguides. In FIGS. 3 and 4, the magnitude of the phase shift is plotted from 0° to 360° on the abscissa, and the intensity of the output signals is plotted on the ordinate. The intensity of the light coupled out at each of the outputs varies with the phase shift in the form of a trigonometric function or a sine function. Each of these trigonometric functions of different outputs is shifted by a fourth or an eighth of the total angular range. As is apparent from FIG. 3, for example, the output A2 reaches its maximum output value for a phase shift of 45°, and the minimum output value for a phase shift of 225°. Moreover, the output A1 has a 90° phase shift, i.e., the maximum of the intensity is reached at a phase shift of the input signals of 135°, and the minimum is reached at 315°. The output intensity of the output A3 is shifted by 180° with respect to A2, i.e., the maximum intensity is at a phase shift of the input signals of 225°, and the minimum intensity is at 45°. The same applies analogously to the exemplary embodiment having eight output waveguides shown in FIG. 4. The principles depicted using FIGS. 3 and 4 may easily be applied to a hybrid coupler having more or fewer outputs.

The output waveguides 122 of the hybrid coupler 12 are each connected to an associated photodiode 13a, 13b, . . . . For reasons of clarity, only two photodiodes are shown in FIGS. 1 and 2. The photodiodes 13a and 13b are used to convert the optical signals from the waveguides 122 into electrical signals. Moreover, in some specific embodiments of the present invention, more than photodiode may be available per waveguide, for example, to convert positive or negative half-waves separately, or to increase the output voltage, or to carry out plausibility checks on the received signals.

The outputs of the photodiodes 13 simultaneously form the output of the optical input stage 1.

The optical input stage 1 is connected to an analog-digital stage 2. The analog-digital stage 2 corresponds to a plurality of electronic analog-digital converters 21a and 21b which are known per se, to which the output signal of the photodiodes 13 is either supplied directly or by means of an associated optional sample-and-hold element 20a and 20b in each case. Thus, the electrical analog output signal of the photodiodes 13 may be converted into a digital data stream at the output of the analog-digital converter 21 in a manner known per se.

As is apparent from FIG. 1, an analog-digital converter 21a, 21b and an optional sample-and-hold element 20a, 20b is associated with each photodiode 13a, 13b. Thus, the $2^Q$ analog signals are converted into a corresponding number of digital data streams, each being quantized having a resolution of P bits, which are provided by the characteristics of the electronic analog-digital converter.

The digital outputs of the analog-digital converters 21 simultaneously form the output of the analog-digital stage 2. The output of the analog-digital stage 2 is connected to the input of an output stage 3. The output stage 3 is configured to form the digital data stream at the output 31 of the analog-digital converter 5 from the digital output signals of the analog-digital converters 21a, 21b. For this purpose, the output stage 3 includes a selection device which selects one digital input signal which forms the output signal 31 from the plurality of digital input signals at each discrete time step. For this purpose, the output stage 3 includes at least one simple selection rule with which one digital data stream may be selected from the plurality of digital data streams. The selection may, for example, be carried out by means of a conversion table and a digital signal processor, so that the analog-digital converter according to the present invention has a short latency time and a high upper cutoff frequency.

An example of such a selection rule will be explained in greater detail based on FIG. 3. According to one exemplary embodiment of FIG. 3, as the first selection rule, the amplitude is limited between a minimum value and a maximum $U_{min}$ and $U_{max}$. Measured values which lie outside this amplitude range are discarded. As a result, the signal readout may be limited to the approximately linear section of the trigonometric functions, so that a complex deconvolution of the measured values may be avoided. If a limitation to a narrow amplitude range is not possible, for example, because only two optical output signals are available, a deconvolution of the nonlinearly distorted signals may of course also be carried out by means of the digital signal processor of the output stage 3.

After discriminating the signals to the predefinable amplitude range, the positive slope of the output signal is used as a subordinate criterion. This may be carried out directly by determining the slope or by comparing the preselected output signal with the nearest output signal on the right in the diagram of FIG. 3. Thus, for phase shifts between 0 and 90°, the output A1 is used for determining the digital output value. For phase shifts between 90° and 180°, the output A3 is used. For phase shifts between 180° and 270°, the output A4 is used, and for phase shifts between 270° and 360°, the output A2 is used.

The basic principle of the present invention is based on the fact that the amplitude of the analog input signal in the input stage 1 is mapped to a range of the phase shift from 0° to 360°, but each analog-digital converter has to process only a subrange, so that multiple analog-digital converters are available for the total amplitude range, which together provide a higher resolution.

The presently described selection rules are again described below based on examples. In the first example, the analog input signal S(t) has a voltage which causes a phase shift of 50° in the phase-modulated output signal at the output 112 of the modulator 11. As is apparent from FIG. 3, at a phase shift of 50°, only the output values of the outputs A4 and A1 are in the preset amplitude range between $U_{min}$ and $U_{max}$. The outputs A2 and A3 may thus be discarded. If the slope of the output voltage profiles is subsequently ascertained and a positive slope is determined as the selection criterion, the output A4 may be discarded and the digital value supplied by the output A1 forms the output value of the analog-digital converter in this time interval.

Alternatively or additionally, instead of the slope, a comparison of the output values with the nearest neighbor in each case may be carried out. Thus, the value present at the output A4 is compared with the value of the output A2. This comparison reveals that at a phase shift of 50°, A4 has a smaller amplitude than A2. Therefore, A4 is discarded, since the larger value is always to be chosen, but A2 was already discarded in the first selection step. Alternatively or additionally, A1 may also be compared with A3. This comparison reveals that A1 has the larger amplitude. Therefore, A1 is chosen as the applicable output.

In the second example, the analog input signal S(t) is to cause a phase shift of 230°. In this case as well, the amplitude criterion results again in a selection between A4 or A1. The comparison of A4 with A2 reveals that A4 has the larger amplitude and is thus applicable. The comparison between A1 and A3 reveals that A1 has a lower amplitude. Therefore, A1 is discarded.

In the same way as described above for four output signals A1 to A4, the same selection criteria may also be applied to a hybrid coupler having eight outputs, as shown based on FIG. 4. In this case as well, at least one signal preselected in the first step must be compared with its nearest neighbor in each case, as shown based on the following table:

| Preselected signal | Comparison signal |
|---|---|
| A1 | A2 |
| A2 | A3 |
| A3 | A4 |
| A4 | A5 |
| A5 | A6 |
| A6 | A7 |
| A7 | A8 |
| A8 | A1 |

As is furthermore apparent from FIG. 4, the limits of the amplitude range $U_{min}$ to $U_{max}$ may be chosen more narrowly if multiple output signals are available. As a result, an improved approximation of the trigonometric functions to first-order polynomials results, so that the error generated during the readout is smaller.

Figure 5:
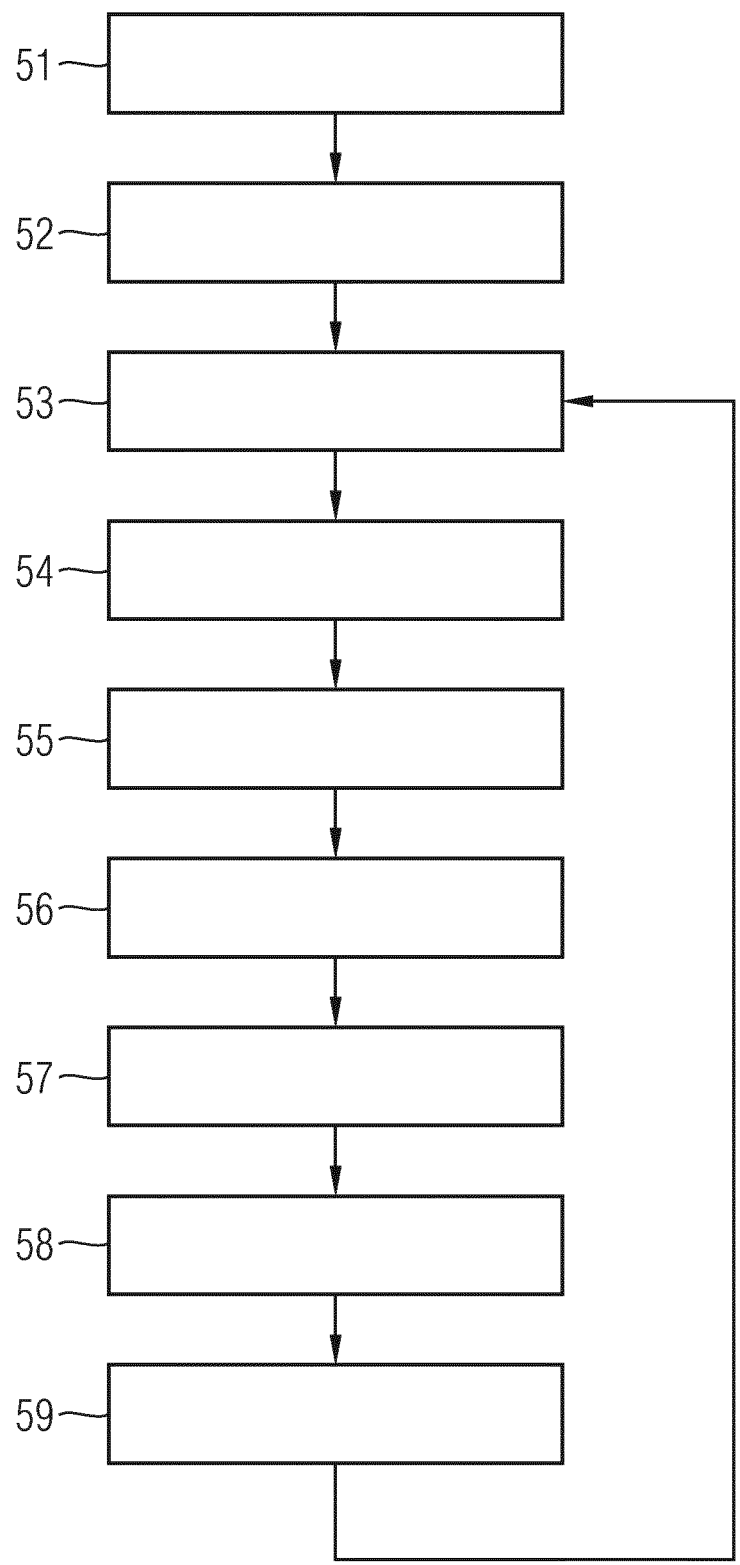
FIG. 5 shows a flow chart of the method according to the present invention.

FIG. 5 once again illustrates a flow chart of the method according to the present invention. In the first method step 51, an optical carrier signal is provided by means of a laser. In the second method step 52, this carrier signal is divided into a reference path and a signal path.

Subsequently, in the third method step 53, the modulation of the optical carrier path is carried out in the signal path, so that a phase-shifted analog optical signal is available at the output of the modulator which represents the electrical analog input signal.

In step 54, the phase-modulated optical signal is supplied to a hybrid coupler having a plurality of inputs and a plurality of outputs. As a result, the phase-modulated signal is coupled into a plurality of output waveguides, the intensity of the optical signal in different output waveguides being different as a function of the phase.

In method step 55, this plurality of optical signals is converted into electrical signals, for example, by means of at least one associated photodiode in each case.

The electrical signals obtained in method step 55 are supplied in method step 56 to an analog-digital converter which digitizes the electrical signals at a predefinable resolution in a manner known per se. The output signals of the analog-digital converters are supplied to the output stage 3.

The output stage 3 carries out a selection of the digital signals. For this purpose, in method step 57, a discrimination of the signals is carried out according to amplitude, so that output signals having an amplitude lower than $U_{min}$ are discarded, and output signals having an amplitude above $U_{max}$ are also discarded. In method step 58, the remaining output signals are furthermore discriminated according to slope, for example, only signals having a positive slope may be accepted as valid. In method step 59, the digital signal thus selected is provided as the output signal 31. As of method step 53, the method subsequently 53 runs again, so that with each complete iteration, a discrete digital value is output which represents the analog input signal S(t) at each point in time.

Of course, the present invention is not limited to the specific embodiments shown in the figures. The present description is therefore not to be regarded as limiting, but rather as illustrative. The claims below should be understood to mean that a stated feature is present in at least one specific embodiment of the present invention. This does not rule out the presence of additional features.

The invention claimed is:

1. An analog-digital converter having at least one input to which at least one analog input signal (S(t)) may be supplied, and having at least one output which is configured to output a digital data stream which represents the analog input signal, wherein
    the analog-digital converter has an optical input stage which is configured to convert the analog input signal (S(t)) into a phase-modulated optical signal and to supply it to a hybrid coupler configured to transform the phase-modulated optical signal into a plurality of amplitude-modulated signals which are supplied to a plurality of output waveguides, each output waveguide being connected to at least one photodiode, each of said photodiodes having electrical connecting contacts,
    the electrical connecting contacts of each of the photodiodes are connected to an associated analog-digital converter via which an analog electrical input signal is converted into a digital electrical output signal, and said digital electrical output signals are connected to an output stage which is configured to form the digital data stream from the digital electrical output signals of the analog-digital converters, wherein
    the output stage is configured to select one digital electrical output signal of the analog-digital converter which lies within a predefined range of the amplitude and has a predefined slope and/or is larger than a predefined adjacent output signal, said selected digital electrical output signal forming said digital data stream.

2. The analog-digital converter as claimed in claim 1, wherein the optical input stage includes at least one Mach-Zehnder modulator and at least one laser.

3. The analog-digital converter as claimed in claim 2, wherein the laser is operable in pulsed operation.

4. The analog-digital converter as claimed in claim 2, wherein the laser is operable in continuous-wave operation.

5. The analog-digital converter as claimed in claim 1, wherein the hybrid coupler has $2^Q$ output waveguides and/or that the hybrid coupler has a 2×2 or a 4×4 or an 8×8 multimode interference coupler.

6. The analog-digital converter as claimed in claim 1, wherein the hybrid coupler is configured to couple input signals of a different phase having a different intensity into the output waveguide.

7. The analog-digital converter as claimed in claim 1, wherein the output stage is configured to select the output signal of an analog-digital converter as a function of the phase difference of the signals at the input of the hybrid coupler and to provide it as the output signal of the analog-digital converter at the output.

8. The analog-digital converter as claimed in claim 1, wherein the output stage has a digital signal processor and/or a conversion table.

9. The analog-digital converter as claimed in claim 1, wherein the hybrid coupler has $2^Q$ output waveguides, and the analog-digital converters each have a resolution of P bits, and the analog input signal may be provided at the output of the analog-digital converter having a resolution of (P+Q) bits.

10. A method for generating a digital data stream which represents an analog input signal, wherein the analog input signal (S(t)) is converted into a phase-modulated optical signal, the phase-modulated optical signal is transformed into a plurality of amplitude modulated signals, which are supplied to a hybrid coupler having a plurality of output waveguides, each of which are connected to at least one photodiode,
    each of the electrical output signals of the photodiodes are supplied to the input of an associated analog-digital converter, via which an analog electrical input signal is converted into a digital electrical output signal, and
    one signal is selected from the digital output signals of the analog-digital converters, in order to form the digital data stream, wherein the output signal of the analog-digital converter is selected which lies within a predefinable range of the amplitude and has a positive slope and/or is larger than a predefinable adjacent output signal.

11. The method as claimed in claim 10, wherein the laser is operated in continuous-wave operation.

12. The method as claimed in claim 10, wherein input signals of a different phase having a different intensity are coupled into the $2^Q$ output waveguides of the hybrid coupler.

* * * * *